(12) United States Patent
Jaworowski et al.

(10) Patent No.: US 12,139,639 B2
(45) Date of Patent: Nov. 12, 2024

(54) ALUMINUM HEAT EXCHANGER

(71) Applicant: Carrier Corporation, Farmington, CT (US)

(72) Inventors: Mark R. Jaworowski, Glastonbury, CT (US); Mary Teresa Lombardo, Windsor, CT (US); Michael F. Taras, Fayetteville, NY (US); Mel Woldesemayat, Liverpool, NY (US); Stephanie Bealing, West Hartford, CT (US); Matthew Patterson, East Syracuse, NY (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 79 days.

(21) Appl. No.: 14/771,740

(22) PCT Filed: Feb. 28, 2014

(86) PCT No.: PCT/US2014/019485
§ 371 (c)(1),
(2) Date: Aug. 31, 2015

(87) PCT Pub. No.: WO2014/134479
PCT Pub. Date: Sep. 4, 2014

(65) Prior Publication Data
US 2016/0014929 A1    Jan. 14, 2016

Related U.S. Application Data

(60) Provisional application No. 61/771,527, filed on Mar. 1, 2013.

(51) Int. Cl.
*F28D 1/04* (2006.01)
*B23P 15/26* (2006.01)
(Continued)

(52) U.S. Cl.
CPC ............... *C09D 7/61* (2018.01); *B23P 15/26* (2013.01); *C09D 5/084* (2013.01); *C23C 22/34* (2013.01);
(Continued)

(58) Field of Classification Search
CPC .......... C09D 7/61; C09D 5/084; B23P 15/26; C23C 22/34; C23C 22/361; H05K 7/20254; F28F 19/02; F28F 21/084
(Continued)

(56) References Cited

U.S. PATENT DOCUMENTS 3,986,970 A * 10/1976 Shiga .................. C23F 1/30
                                                216/107
6,113,667 A *  9/2000 Hyogo ................. F28F 9/18
                                                148/437

(Continued)

FOREIGN PATENT DOCUMENTS

CN    1520467 A    8/2004
CN    1611911 A    5/2005
(Continued)

OTHER PUBLICATIONS

Office Action regarding related CN App. No. 201480024532.7; dated Aug. 24, 2017; English translation attached; 8 pgs.
(Continued)

*Primary Examiner* — Davis D Hwu
(74) *Attorney, Agent, or Firm* — CANTOR COLBURN LLP

(57) ABSTRACT

A heat transfer system is disclosed that includes a heat transfer fluid circulation loop, and also a heat exchanger that includes an aluminum alloy exterior surface having thereon a top surface coat derived from a composition comprising a trivalent chromium salt and an alkali metal hexafluorozirconate.

8 Claims, 3 Drawing Sheets

(51) Int. Cl.

| | | |
|---|---|---|
| *C09D 5/08* | (2006.01) | |
| *C09D 7/61* | (2018.01) | |
| *C23C 22/34* | (2006.01) | |
| *C23C 22/36* | (2006.01) | |
| *F28F 19/02* | (2006.01) | |
| *F28F 21/08* | (2006.01) | |
| *H05K 7/20* | (2006.01) | |
| *F28F 19/06* | (2006.01) | |

(52) U.S. Cl.
CPC ............ *C23C 22/361* (2013.01); *F28F 19/02* (2013.01); *F28F 21/084* (2013.01); *H05K 7/20254* (2013.01); *C23C 2222/10* (2013.01); *F28F 19/06* (2013.01)

(58) Field of Classification Search
USPC .................................................. 165/151, 133
See application file for complete search history.

(56) References Cited

U.S. PATENT DOCUMENTS

| 6,375,726 | B1 | 4/2002 | Matzdorf et al. |
|---|---|---|---|
| 6,521,029 | B1 | 2/2003 | Matzdorf et al. |
| 6,663,700 | B1 | 12/2003 | Matzdorf et al. |
| 2003/0000686 | A1* | 1/2003 | Kester .................. F28F 17/005 165/151 |
| 2006/0240191 | A1 | 10/2006 | Matzdorf et al. |
| 2009/0050239 | A1 | 2/2009 | Honda et al. |
| 2015/0184951 | A1* | 7/2015 | Lee ......................... F28D 1/053 165/151 |

FOREIGN PATENT DOCUMENTS

| CN | 202229475 | U | 5/2012 |
|---|---|---|---|
| EP | 0937757 | A1 | 8/1999 |
| JP | 2005257257 | A | 9/2005 |
| JP | 2006069197 | A | 3/2006 |
| WO | 03040437 | A1 | 5/2003 |
| WO | 2005078372 | A1 | 8/2005 |
| WO | 2012018536 | A2 | 2/2012 |
| WO | 2013138218 | A1 | 9/2013 |

OTHER PUBLICATIONS

Office Action regarding related CN App. No. 201480024532.7; dated Jan. 11, 2017; English translation attached; 10 pgs.
International Preliminary Report on Patentability for Application No. PCT/US2014/019485 dated Sep. 11, 2015; 7 pgs.
International Search Report and Written Opinion for Application No. PCT/US2014/019485 dated Aug. 29, 2014; 10 pages.
Hashimoto et al.; "Trivalent Chromium Conversion Coating Formation on Aluminium"; Surface & Coatings Technology; vol. 280; 2015; pp. 317-329.
European Opposition for Application No. 14712085.1; Issued Aug. 17, 2021; 25 Pages.

* cited by examiner

ALUMINUM HEAT EXCHANGER

CROSS REFERENCE TO RELATED APPLICATIONS

This application is a National Phase Application of Patent Application PCT/US2014/019485 filed on Feb. 28, 2014, which claims priority to U.S. 61/771,527 filed Mar. 1, 2013, the contents of each which are incorporated herein by reference in their entireties.

BACKGROUND OF THE INVENTION

The subject matter disclosed herein generally relates to heat exchangers and, more particularly, to aluminum heat exchangers that are resistant to corrosion.

Heat exchangers are widely used in various applications, including but not limited to heating and cooling systems including fan coil units, heating and cooling in various industrial and chemical processes, heat recovery systems, and the like, to name a few. Many heat exchangers for transferring heat from one fluid to another fluid utilize one or more tubes through which one fluid flows while a second fluid flows around the tubes. Heat from one of the fluids is transferred to the other fluid by conduction through the tube walls. Many configurations also utilize fins in thermally conductive contact with the outside of the tube(s) to provide increased surface area across which heat can be transferred between the fluids, improve heat transfer characteristics of the second fluid flowing through the heat exchanger and enhance structural rigidity of the heat exchanger. Such heat exchangers include microchannel heat exchangers and round tube plate fin (RTPF) heat exchangers.

Heat exchanger tubes may be made from a variety of materials, including aluminum, copper and alloys thereof. Aluminum alloys are lightweight, have a relatively high specific strength and high heat conductivity. Due to these excellent mechanical properties, aluminum alloys are used in heat exchangers for heating and cooling systems in commercial, industrial, residential, transport, refrigeration, and marine applications. However, aluminum alloy heat exchangers can be susceptible to corrosion. In applications in or close to marine environments, particularly, sea water or wind-blown seawater mist create an aggressive chloride environment that is detrimental for these heat exchangers. This chloride environment rapidly causes localized and general corrosion of braze joints, fins, and refrigerant tubes. The corrosion modes include galvanic, crevice, and pitting corrosion. Corrosion impairs the heat exchanger ability to transfer heat, as fins lose their structural integrity and contact with the refrigerant tubes and corrosion products accumulate on the heat exchanger external surfaces creating an extra thermal resistance layer and increasing airflow impedance. Corrosion eventually leads to a loss of refrigerant due to tube perforation and failure of the cooling system. Accordingly, improvements in corrosion durability of aluminum alloy heat exchangers would be well received in the art.

Surface coatings have been used to provide protection against corrosion by imposing a physical barrier between salt water in the environment and aluminum components of the heat exchanger. Coating types include electroplating, dip coating, spray coating and powder coating. However, conventional polymer surface coatings can suffer from a number of problems such as inadequate or uneven thickness, pinholes and other gaps in coating coverage, and the necessity of extensive surface preparation of the aluminum substrate prior to application of the coating in order to provide adequate bonding between the coating and the substrate, in addition to the cost, time and complexity of applying the polymer coating. Heat exchangers, by their nature, exhibit large and frequent temperature variations, which can lead to the delamination and disbanding of the polymer coatings. Furthermore, polymer coatings create a layer which is resistive to heat transfer and can create a loss in efficiency for the heat exchanger. Metal surface treatments such as TCP (trivalent chromium process developed by the U.S. Naval Air Warfare Center Aircraft Division) have been used to prepare heat exchanger surfaces for subsequent application of polymer coatings as described in US patent application publication no. 2012/0183755 A1; however, such coatings are still subject to the issues described above.

BRIEF DESCRIPTION OF THE INVENTION

According to one aspect of the invention, a heat transfer system comprises a heat transfer fluid circulation loop. The heat transfer system includes a heat exchanger disposed in the heat transfer fluid circulation loop, the heat exchanger comprising an aluminum alloy exterior surface having thereon a top surface coat derived from a composition comprising a trivalent chromium salt and an alkali metal hexafluorozirconate.

According to another aspect of the invention, a method of producing a heat transfer system comprises contacting an aluminum alloy exterior surface of a heat exchanger with a composition comprising a trivalent chromium salt and an alkali metal hexafluorozirconate to form a top surface coat on the aluminum alloy surface, and assembling the heat exchanger comprising the top surface coat into a heat transfer fluid circulation loop.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawing in which:

DETAILED DESCRIPTION OF THE INVENTION

Figure 1:
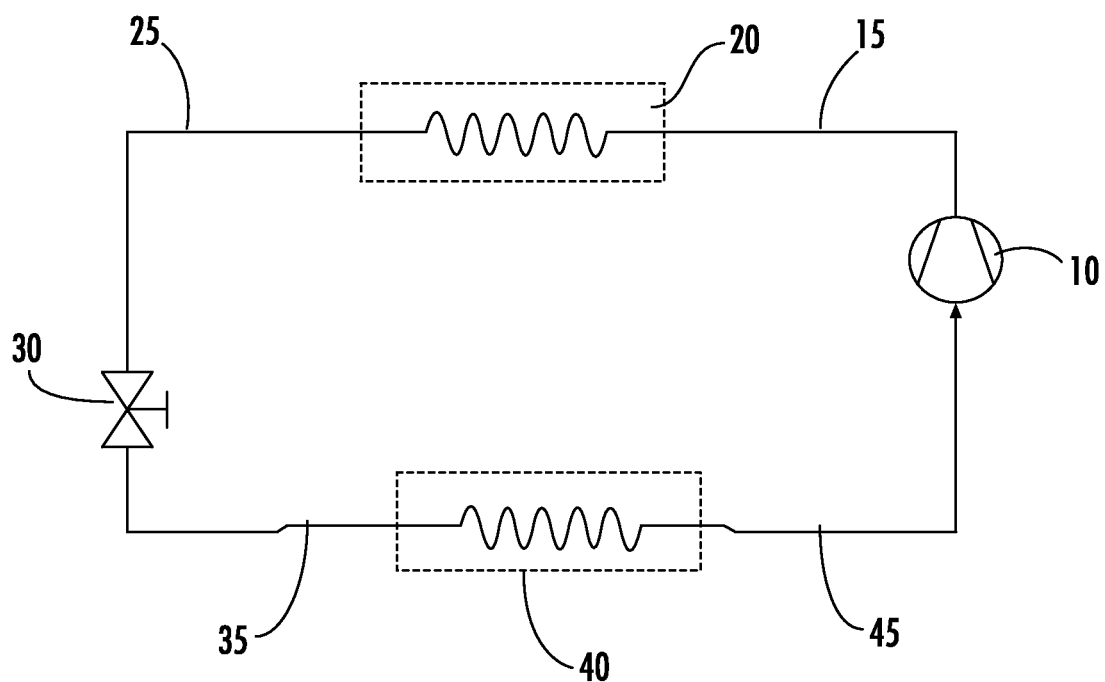
FIG. 1 depicts a schematic diagram of an exemplary heat transfer system.

Referring now to the Figures, an exemplary heat transfer system with a heat transfer fluid circulation loop is shown in block diagram form in FIG. 1. As shown in FIG. 1, a compressor 10 pressurizes heat transfer fluid in its gaseous state, which both heats the fluid and provides pressure to circulate it throughout the system. The hot pressurized gaseous heat transfer fluid exiting from the compressor 10 flows through conduit 15 to condenser heat exchanger 20, which functions as a heat exchanger to transfer heat from the heat transfer fluid to the surrounding environment, resulting in condensation of the hot gaseous heat transfer fluid to a pressurized moderate temperature liquid. The liquid heat transfer fluid exiting from the condenser 20 flows through conduit 25 to expansion valve 30, where the pressure is reduced. The reduced pressure liquid heat transfer fluid exiting the expansion valve 30 flows through conduit 35 to evaporator heat exchanger 40, which functions as a heat exchanger to absorb heat from the surrounding environment and boil the heat transfer fluid. Gaseous heat transfer fluid exiting the evaporator 40 flows through conduit 45 to the compressor 10, thus completing the heat transfer fluid loop. The heat transfer system has the effect of transferring heat from the environment surrounding the evaporator 40 to the environment surrounding the condenser 20. The thermodynamic properties of the heat transfer fluid allow it to reach a high enough temperature when compressed so that it is greater than the environment surrounding the condenser 20, allowing heat to be transferred to the surrounding environment. The thermodynamic properties of the heat transfer fluid must also have a boiling point at its post-expansion pressure that allows the environment surrounding the evaporator 40 to provide heat at a temperature to vaporize the liquid heat transfer fluid.

The heat transfer system shown in FIG. 1 can be used as an air conditioning system, in which the exterior of condensr heat exchanger 20 is contacted with air in the surrounding outside environment and the evaporator heat exchanger 40 is contacted with air in an interior environment to be conditioned. Additionally, as is known in the art, the system can also be operated in heat pump mode using a standard multiport switching valve to reverse heat transfer fluid flow direction and the function of the condenser and evaporator heat exchangers, i.e. the condenser in a cooling mode being evaporator in a heat pump mode and the evaporator in a cooling mode being the condenser in a heat pump mode. Additionally, while the heat transfer system shown in FIG. 1 has evaporation and condensation stages for highly efficient heat transfer, other types of heat transfer fluid loops are contemplated as well, such as fluid loops that do not involve a phase change, for example, multi-loop systems such as commercial refrigeration or air conditioning systems systems where a non-phase change loop thermally connects one of the heat exchangers in an evaporation/condensation loop like FIG. 1 to a surrounding outside environment or to an interior environment to be conditioned. Regardless of the specific configuration of the heat transfer fluid circulation loop, a heat exchanger may be disposed in a potentially corrosive environment such as a marine or ocean shore environment.

Figure 2:
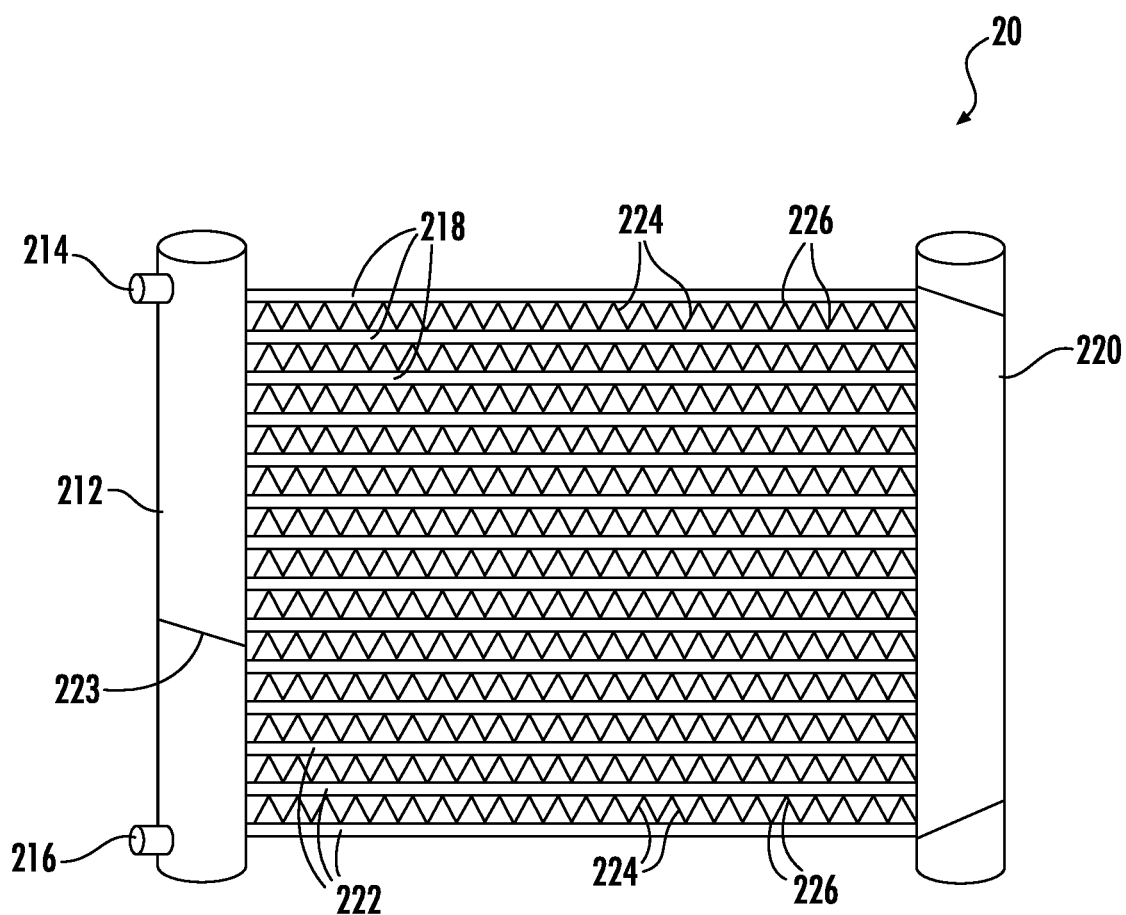
FIG. 2 depicts a schematic diagram of an exemplary heat exchanger.

One type of exemplary heat exchanger that can be used according to the embodiments described herein is a micro-channel or mini-channel heat exchanger. The configuration of these types of heat exchangers is generally the same, with the primary difference being rather loosely applied based on the size of heat transfer tube ports. For the sake of convenience, this type of heat exchanger will be referred to herein as a micro-channel heat exchanger. As shown in FIG. 2, a micro-channel heat exchanger 20 includes first manifold 212 having inlet 214 for receiving a working fluid, such as coolant, and outlet 216 for discharging the working fluid. First manifold 212 is fluidly connected to each of a plurality of tubes 218 that are each fluidly connected on an opposite end with second manifold 220. Second manifold 220 is fluidly connected with each of a plurality of tubes 222 that return the working fluid to first manifold 212 for discharge through outlet 216. Partition 223 is located within first manifold 212 to separate inlet and outlet sections of first manifold 212. Tubes 218 and 222 can include channels, such as microchannels, for conveying the working fluid. The two-pass working fluid flow configuration described above is only one of many possible design arrangements. Single and other multi-pass fluid flow configurations can be obtained by placing partitions 223, inlet 214 and outlet 216 at specific locations within first manifold 212 and second manifold 220.

Fins 224 extend between tubes 218 and the tubes 222 as shown in the Figure. Fins 224 support tubes 218 and tubes 222 and establish open flow channels between the tubes 218 and tubes 222 (e.g., for airflow) to provide additional heat transfer surfaces and enhance heat transfer characteristics. Fins 224 also provide support to the heat exchanger structure. Fins 224 are bonded to tubes 218 and 222 at brazed joints 226. Fins 224 are not limited to the triangular cross-sections shown in FIG. 2, as other fin configurations (e.g., rectangular, trapezoidal, oval, sinusoidal) can be used as well. Fins 224 may have louvers to improve heat transfer.

Figure 3:
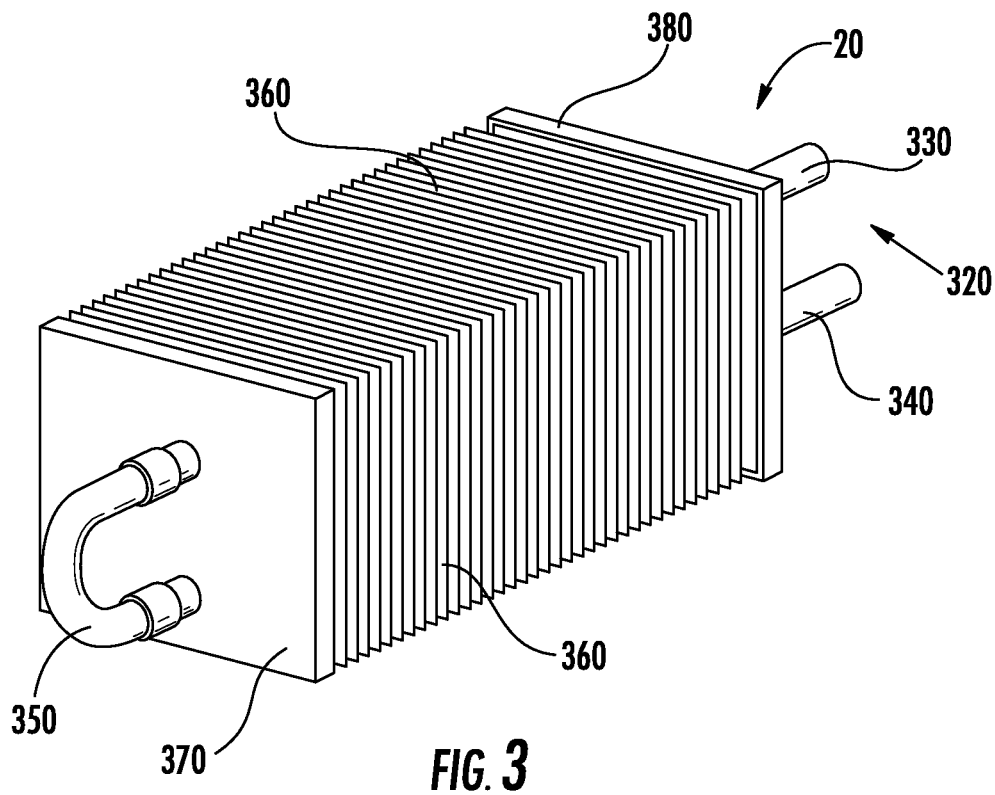
FIG. 3 depicts a schematic diagram of another exemplary heat exchanger.

Referring now to FIG. 3, an exemplary RTPF (round tube plate fin) heat exchanger is shown. As shown in FIG. 3, a heat exchanger 20 includes one or more flow circuits for carrying refrigerant. For the purposes of explanation, the heat exchanger 20 is shown with a single flow circuit refrigerant tube 320 consisting of an inlet line 330 and an outlet line 340. The inlet line 330 is connected to the outlet line 340 at one end of the heat exchanger 20 through a 90 degree tube bend 350. It should be evident, however, that more circuits may be added to the unit depending upon the demands of the system. For example, although tube bend 350 is shown as a separate component connecting two straight tube section, the tube 320 can also be formed as a single tube piece with a hairpin section therein for the tube bend 350, and multiple units of such hairpin tubes can be connected with u-shaped connectors at the open ends to form a continuous longer flow path in a 'back-and-forth' configuration. The heat exchanger 20 further includes a series of fins 360 comprising radially disposed plate-like elements spaced along the length of the flow circuit, typically connected to the tube(s) 320 with an interference fit. The fins 360 are provided between a pair of end plates or tube sheets 370 and 380 and are supported by the lines 330, 340 in order to define a gas flow passage through which conditioned air passes over the refrigerant tube 320 and between the spaced fins 360. Fins 360 may include heat transfer enhancement elements such louvers.

The refrigerant tubes can be made of an aluminum alloy based core material and, in some embodiments, may be made from aluminum alloys selected from 1000 series, 3000 series, 5000 series, or 6000 series aluminum alloys. The fins can be made of an aluminum alloy substrate material such as, for example, materials selected from the 1000 series, 3000 series, 6000 series, 7000 series, or 8000 series aluminum alloys. The embodiments described herein utilize an aluminum alloy for the fins of a tube-fin heat exchanger having an aluminum alloy tube, i.e., a so-called "all aluminum" heat exchanger. In some embodiments, components through which refrigerant flows, such as tubes and/or manifolds, can be made of an alloy that is electrochemically more cathodic than connected components through which refrigerant does not flow (e.g., fins). This ensures that any galvanic corrosion will occur in non-flow-through components rather than in flow-through components, in order to avoid refrigerant leaks.

As mentioned above, heat exchanger component connections, such as between tubes and fins, or between tubes and manifolds, can be connected by brazing. Brazing compositions for aluminum components are well-known in the art as described, for example, in U.S. Pat. Nos. 4,929,511, 5,820, 698, 6,113,667, and 6,610,247, the disclosures of each of which are incorporated herein by reference in their entirety. Brazing compositions for aluminum can include various metals and metalloids, including but not limited to silicon, aluminum, zinc, magnesium, calcium, lanthanide metals, and the like. In some embodiments, the brazing composition includes metals more electrochemically anodic than aluminum (e.g., zinc), in order to provide sacrificial galvanic corrosion in the braze joint(s) instead of the refrigerant tube(s).

A flux material can be used to facilitate the brazing process. Flux materials for brazing of aluminum components can include high melting point (e.g., from about 564° C. to about 577° C.), such as LiF and/or $KAlF_4$. Other compositions can be utilized, including cesium, zinc, and silicon. The flux material can be applied to the aluminum alloy surface before brazing, or it can be included in the brazing composition. After the brazing is complete, any flux residue can be removed prior to contact with the trivalent chromium composition, but it does not have to be. Therefore, in some embodiments, the flux material is not removed prior to contact with the trivalent chromium composition.

In some embodiments, a metal more electrochemically anodic than aluminum, such as zinc, can be applied to a surface of the heat exchanger before brazing and before contact with the trivalent chromium composition. Various techniques can be used to apply the anodic metal, such as electrodeposition, physical vapor deposition, or various methods of thermal spray such as plasma spray, flame spray, cold spray, HVOF, and other known thermal spray techniques. Alternatively, a layer of zinc or zinc powder can be physically applied to the surface and then heated, as is known in the art. This anodic layer can be thermally diffused into the aluminum substrate, e.g., to a depth of 80-100 µm. The application of a top surface coat of trivalent chromium composition acts to enhance the protection of this anodic layer.

In an embodiment, a heat transfer system comprises a heat transfer fluid circulation loop comprising a heat exchanger disposed in said heat transfer fluid circulation loop, the heat exchanger comprising an aluminum alloy exterior surface having thereon a top surface coat on at least a portion of the heat exchanger derived from a composition comprising a trivalent chromium salt and an alkali metal hexafluorozirconate.

In an embodiment, the heat exchanger comprises a first aluminum alloy component connected by brazing to a second aluminum alloy component. The top surface coat is disposed over the first aluminum alloy component, the second aluminum alloy component, and the brazing connecting the first and second aluminum alloy components. In an embodiment, the brazing comprises zinc. The brazing includes residue of a brazing flux on the surface thereof, comprising a metal salt with a melting point of 564° C. to 577° C. The metal salt comprises LiF and/or $KAlF_4$.

The aluminum alloy exterior surface includes zinc enrichment of the aluminum alloy surface below said top surface coat. The zinc is applied to the aluminum alloy surface as elemental zinc by physical vapor deposition or thermal spray prior to contact with said composition. The heat exchanger is a minichannel or microchannel heat exchanger.

In an embodiment, the heat exchanger is a round tube plate fin heat exchanger. In another embodiment, the entire surface of the heat exchanger is covered by said top surface coat. In an embodiment, only return bend tube portions of the round tube plate fin heat exchanger are covered by said top surface coat.

As described herein, a surface of the heat exchanger has a top surface coat on at least a portion thereof derived from a composition comprising a trivalent chromium salt and an alkali metal hexafluorozirconate. Such compositions, along with methods for applying to metal surfaces are described in detail in U.S. Pat. Nos. 6,375,726, 6,511,532, and 6,521,029, the disclosure of each of which is incorporated herein by reference in its entirety.

The trivalent chromium salt can contain various anions along with the trivalent chromium. Exemplary anions include nitrate, sulfate, phosphate, and/or acetate. Specific exemplary trivalent chromium salts can include $Cr_2(SO_4)_3$, $(NH_4)_4Cr(SO_4)_2$, $KCr(SO_4)_2$, and mixtures comprising any of the foregoing. The concentration of the trivalent chromium salt in the composition, per liter of solution, can range from about 0.01 g to about 22 g, more specifically from about 3 g to about 12 g, and even more specifically from about 4 g to about 8.0 g.

The alkali metal hexafluorozirconate can contain various cations such as potassium or sodium. The concentration of alkali metal hexafluorozirconate, per liter of solution, can range from about 0.01 g to about 12 g, more specifically from about 6 g to about 10 g.

In some embodiments, the composition can also comprise an alkali metal tetrafluoroborate and/or an alkali metal hexafluorosilicate, such as potassium or sodium tetrafluoroborate, or potassium or sodium hexafluorosilicate. The concentration of the alkali metal tetrafluoroborate and/or an alkali metal hexafluorosilicate, per liter of solution, can range from about 0.01 g to about 12 g, more specifically from about 6 g to about 10 g.

As mentioned above, the trivalent chromium composition is acidic. More specifically, the composition can be an acidic aqueous solution having a pH ranging from about 2 to about 6, more specifically from about 2.5 to about 4.5, and even more specifically from about 3.7 to about 4.0. Acidity can be provided by incorporating the acid of the trivalent chromium salt, or alternatively by any known acid such as sulfuric acid, nitric acid, phosphoric acid, and/or acetic acid.

In some embodiments, the composition optionally comprises a water soluble thickener. When present, a water-soluble thickener such as cellulose derivatives, starches, and/or soluble gums can be present in the acidic solution in amounts ranging from about 0.1 g to about 10 g per liter, more specifically from about 0.1 g to about 2.0 g, even more specifically from about 0.5 g to about 2.0 g, and even more specifically from about 0.5 g to about 1.5 g, s liter of the aqueous solution. Specific examples of thickeners include the cellulose compounds, e.g. hydroxypropyl cellulose, ethyl cellulose, hydroxyethyl cellulose, colloidal silica, clays, starches, gums, and various combinations thereof.

In some embodiments, the composition optionally comprises a water-soluble surfactant. When present, a surfactant can be present in the acidic solution in amounts ranging from about 0.1 g to about 10 g per liter, more specifically from about 0.1 g to about 2.0 g, even more specifically from about 0.5 g to about 2.0 g, and even more specifically from about 0.5 g to about 1.5 g, per liter of the aqueous solution. These surfactants are known in the art of aqueous solutions and include organic compounds that are non-ionic, cationic, and/or anionic surfactants. Exemplary surfactants include the monocarboxyl imidoazoline, alkyl sulfate sodium salts (DUPONOL®), tridecyloxy poly(alkyleneoxy ethanol), ethoxylated or propoxylated alkyl phenol (IGEPAL®), alkyl sulfoamides, alkaryl sulfonates, palmitic alkanol amides (CENTROL®), octylphenyl polyethoxy ethanol (TRITON®), sorbitan monopalmitate (SPAN®), dodecylphenyl polyethylene glycol ether (e.g. TERGITROL®), alkyl pyrrolidone, polyalkoxylated fatty acid esters, alkylbenzene sulfonates and mixtures thereof. Other known water soluble surfactants are disclosed by "Surfactants and Detersive Systems", published by John Wiley & Sons in Kirk-Othmer's Encyclopedia of Chemical Technology, $3^{rd}$ Ed.

Figure 4:
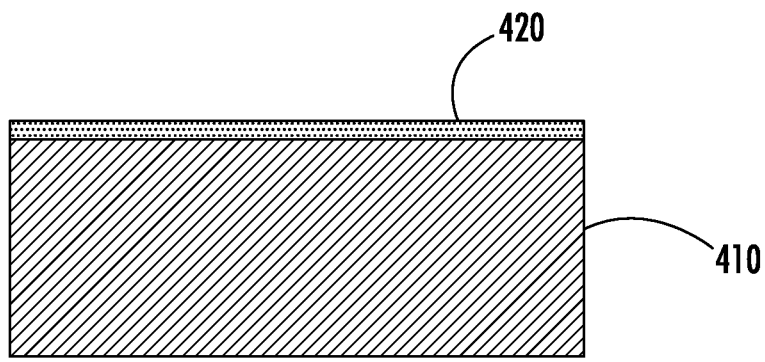
FIG. 4 depicts a schematic diagram of a cross-sectional view of an aluminum alloy surface of a heat exchanger.

The treatment composition can be applied by any of a number of known coating techniques, including dip coating, spray coating, brush coating, roll coating, etc. The composition can be applied to only a portion of the aluminum alloy surface(s) of the heat exchanger, e.g., those particularly susceptible to corrosion, such as u-shaped tubes or hairpin tube sections of a RTPF heat exchanger, or it can be applied to the entire surface of the heat exchanger. In some embodiments, dip coating is effectively used to cover the entire surface of the heat exchanger. In some embodiments, agitation of either the heat exchanger work-piece in the coating solution or of the liquid solution itself (e.g., with jets or mechanical agitation) is used during dip coating. In some embodiments, a microchannel heat exchanger is oriented with the tubes generally vertical during dip coating or during removal from the coating bath. In some embodiments, a RTPF heat exchanger is oriented with the tubes generally horizontal during dip coating or during removal from the coating bath. The post treatment of the metal coating can be carried out at temperatures ranging from ambient temperatures, e.g., 20° C. or 25° C., up to about 65° C. The duration for which the composition is contacted with the aluminum alloy before subsequent processing such as rinsing and/or drying can range widely. Exemplary contact times can range from 5 to 15 minutes, more specifically from 9 to 11 minutes, and even more specifically about 10 minutes. The coating may be air dried at ambient conditions, or can be subject to accelerated drying by any of the methods known in the art, for example, oven drying, forced air drying, exposure to infra-red lamps, etc. Exemplary drying conditions include about 24 hours at room temperature and less than 50% relative humidity, or about 2 hours at 50. The resulting coating as applied by the methods described above produces a mixed-metal oxide layer of approximately 50-100 nm in thickness permanently integrated with the aluminum alloy. Heat transfer calculations indicate that thermal resistance of this layer is negligible relative to the traditional organic coatings. The coated aluminum surface is schematically depicted in FIG. 4, which shows a cross sectional view of aluminum alloy 410 having a top surface coat of mixed metal oxide layer 420.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A heat transfer system comprising a heat transfer fluid circulation loop and a heat exchanger comprising an aluminum alloy disposed in the heat transfer fluid circulation loop, wherein the heat exchanger is a round tube plate fin heat exchanger; and wherein said heat exchanger has a top surface of a mixed-metal oxide permanently integrated with the aluminum alloy on at least a portion of the heat exchanger, said mixed metal oxide top surface derived from a composition comprising a trivalent chromium salt and an alkali metal hexafluorozirconate in an aqueous solution; where the trivalent chromium salt comprises $(NH_4)Cr(SO_4)_2$, $KCr(SO_4)_2$ and mixtures comprising any of the foregoing; wherein the heat exchanger comprises a first aluminum alloy component connected by brazing to a second aluminum alloy component and wherein the mixed metal oxide top surface is disposed over the first aluminum alloy component, the second aluminum alloy component, return bend tube portions, and the brazing connecting the first and second aluminum alloy components; and wherein the brazing comprises zinc.

2. The heat transfer system of claim 1, wherein the brazing includes residue of a brazing flux on the surface thereof, comprising a metal salt with a melting point of 564° C. to 577° C.

3. The heat transfer system of claim 2, wherein the metal salt comprises LiF and/or $KAlF_4$.

4. The heat transfer system of claim 1, wherein said aluminum alloy includes zinc enrichment of the aluminum alloy surface below said mixed metal oxide top surface.

5. The heat transfer system of claim 1, wherein the entire surface of the heat exchanger is covered by said mixed metal oxide top surface.

6. The heat transfer system of claim 1, wherein said top surface is derived from a composition comprising:
    0.01-22 g/l of $(NH_4)_4Cr(SO_4)_2$, $KCr(SO_4)_2$ and mixtures comprising any of the foregoing;
    0.01-12 g/l of alkali metal hexafluorozirconate;
    0-10 g/l of water-soluble thickener; and
    0-10 g/l of water-soluble surfactant.

7. The heat transfer system of claim 1, wherein said top surface is derived from a composition consisting essentially of:
    0.01-22 g/l of $(NH_4)_4Cr(SO_4)_2$, $KCr(SO_4)_2$ and mixtures comprising any of the foregoing;
    0.01-12 g/l of alkali metal hexafluorozirconate;
    0-10 g/l of water-soluble thickener; and
    0-10 g/l of water-soluble surfactant.

8. The heat transfer system of claim 1, wherein said top surface is derived from a composition consisting of:
    0.01-22 g/l of $(NH_4)_4Cr(SO_4)_2$, $KCr(SO_4)_2$ and mixtures comprising any of the foregoing;
    0.01-12 g/l of alkali metal hexafluorozirconate;
    0-10 g/l of water-soluble thickener; and
    0-10 g/l of water-soluble surfactant.

* * * * *